United States Patent
Ha

(10) Patent No.: US 9,443,911 B2
(45) Date of Patent: Sep. 13, 2016

(54) ELECTRONIC DEVICE AND METHOD FOR FABRICATING THE SAME

(71) Applicant: SK hynix Inc., Icheon (KR)

(72) Inventor: Tae-Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 246 days.

(21) Appl. No.: 14/279,202

(22) Filed: May 15, 2014

(65) Prior Publication Data

US 2015/0162268 A1    Jun. 11, 2015

(30) Foreign Application Priority Data

Dec. 9, 2013 (KR) .................. 10-2013-0152272

(51) Int. Cl.
*H01L 27/24* (2006.01)
*G11C 13/00* (2006.01)

(52) U.S. Cl.
CPC ......... *H01L 27/249* (2013.01); *G11C 13/0002* (2013.01); *G11C 2213/71* (2013.01); *H01L 2924/0002* (2013.01)

(58) Field of Classification Search
CPC .......... G11C 13/0002; G11C 14/0045; G11C 14/009; G11C 2213/71; H01L 27/2481; H01L 27/249
See application file for complete search history.

(56) References Cited

U.S. PATENT DOCUMENTS

| 8,456,888 B2* | 6/2013 | Lee | .......... H01L 45/04 257/E21.004 |
| 8,916,847 B2* | 12/2014 | Lee | .......... H01L 45/04 257/3 |
| 9,245,588 B2* | 1/2016 | Park | .......... H01L 43/08 |

FOREIGN PATENT DOCUMENTS

KR    10-2011-0050011 A    5/2011

OTHER PUBLICATIONS

David Eggleston, "Revolution! The Impact of Emerging Memory", SVP NVM Storage Division, Rambus, Aug. 23, 2012.

* cited by examiner

*Primary Examiner* — Jose R Diaz

(57) ABSTRACT

An electronic device includes a semiconductor memory unit. The semiconductor memory unit includes a plurality of conductive pillars stretching in a direction perpendicular to a substrate, the plurality of conductive pillars arranged in a first direction and a second direction intersecting the first direction, conductive patterns disposed between the conductive pillars, variable resistance layers each of which is disposed between a corresponding one of the conductive pillars and a corresponding one of the conductive patterns, said each of the variable resistance layers contacting the corresponding conductive pattern and the corresponding conductive pillar, first lines disposed between the conductive pillars in the second direction and stretch in the first direction, the first lines contacting the conductive patterns under the conductive patterns, and second lines disposed between the conductive pillars in the first direction and stretch in the second direction, the second lines contacting the conductive patterns over the conductive patterns.

18 Claims, 14 Drawing Sheets

ELECTRONIC DEVICE AND METHOD FOR FABRICATING THE SAME

CROSS-REFERENCE TO RELATED APPLICATIONS

The present application claims priority to Korean Patent Application No. 10-2013-0152272, entitled "ELECTRONIC DEVICE AND METHOD FOR FABRICATING THE SAME" and filed on Dec. 9, 2013, which is incorporated herein by reference in its entirety.

BACKGROUND

1. Field

Embodiments of the present disclosure relates to memory circuits or devices and their applications in electronic devices or systems.

2. Description of the Related Art

As electronic appliances trend toward miniaturization, low power consumption, high performance, multi-functionality, and so on, semiconductor devices capable of storing information in various electronic appliances such as computers, portable communication devices, and so on, have been demanded in the art, and research has been conducted for the semiconductor devices. Such semiconductor devices store data using a characteristic where the devices are switched between different resistive states according to an applied voltage or current. Example devices include RRAM (resistive random access memory) devices, PRAM (phase change random access memory) devices, FRAM (ferroelectric random access memory) devices, MRAM (magnetic random access memory) device, E-fuse devices, and so on.

SUMMARY

Embodiments of the present disclosure relate to memory circuits or devices and their applications in electronic devices or systems. Embodiments include an electronic device that achieves a high degree of integration with reduced process difficulty and obtains memory cell characteristics and operational characteristics.

In one aspect, an electronic device including a semiconductor memory unit that includes: conductive pillars stretched in a direction perpendicular to a substrate and arranged in a first direction and a second direction that intersects the first direction; conductive patterns disposed between the conductive pillars in the first direction and the second direction and contacting the conductive pillars with variable resistance layers interposed therebetween; first lines disposed between the conductive pillars in the second direction to be stretched in the first direction and contacting the conductive patterns under the conductive patterns; and second lines disposed between the conductive pillars in the first direction to be stretched in the second direction and contacting the conductive patterns over the conductive patterns.

Implementations of the above device may include one or more of the following.

The conductive patterns are formed of a material that is different from a material forming the first lines and the second lines. The first lines and the second lines include a material having a lower resistance than the material of the conductive patterns, and the conductive patterns include a material having a lower reactivity than the material of the first lines and the second lines. The first lines and the second lines include a metal, and the conductive patterns include a metal nitride or a noble metal. The first lines, the conductive patterns, and the second lines are iteratively stacked over the substrate in the perpendicular direction. The electronic device further comprises an insulation layer interposed between the first lines and the conductive pillars and between the second lines and the conductive pillars. The electronic device further comprises a selection device layer interposed between the variable resistance layers and the conductive pillars, or between the variable resistance layers and the conductive patterns. The variable resistance layers disposed on the sides of the conductive pillars in the first direction is controlled by the conductive pillars and the second lines, and the variable resistance layers disposed on the sides of the conductive pillars in the second direction is controlled by the conductive pillars and the first lines.

In another aspect, an electronic device including a semiconductor memory unit that includes: a conductive pillar stretched in a direction perpendicular to a substrate; a first conductive pattern and a second conductive pattern contacting a first side and a second side of the conductive pillar with a variable resistance layer interposed therebetween, respectively; a first line stretched in a first direction while contacting the first conductive pattern under the first conductive pattern; and a second line stretched in a second direction that intersects with the first direction while contacting the second conductive pattern over the second conductive pattern.

Implementations of the above device may include one or more of the following.

The first conductive pattern and the second conductive pattern are formed of a material that is different from a material forming the first line and the second line.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, a method for fabricating an electronic device including a semiconductor memory unit includes: forming first lines stretched in a first direction over a substrate; forming a conductive layer having openings that are arranged in the first direction and a second direction that intersects with the first direction over the first lines, wherein columns of the openings arranged in the first direction overlap with the first lines; forming second lines stretched in the second direction over the conductive layer and overlapping with the columns of the openings that are arranged in the second direction; forming holes that separate the conductive layer into a plurality of conductive patterns by selectively etching the conductive layer that does not overlap with the first lines and the second lines; forming a variable resistance layer on a sidewall of each of the holes; and forming a conductive pillar in each of the holes where the variable resistance layer is formed.

Implementations of the above method may include one or more of the following.

The conductive layer is formed of a material that is different from a material forming the first lines and the second lines. Before the forming of the holes, the forming of the first lines, the forming of the conductive layer, and the forming of the second lines are iteratively performed.

These and other aspects, implementations and associated advantages are described in greater detail in the drawings, the description and the claims.

DETAILED DESCRIPTION

Figure 1A:
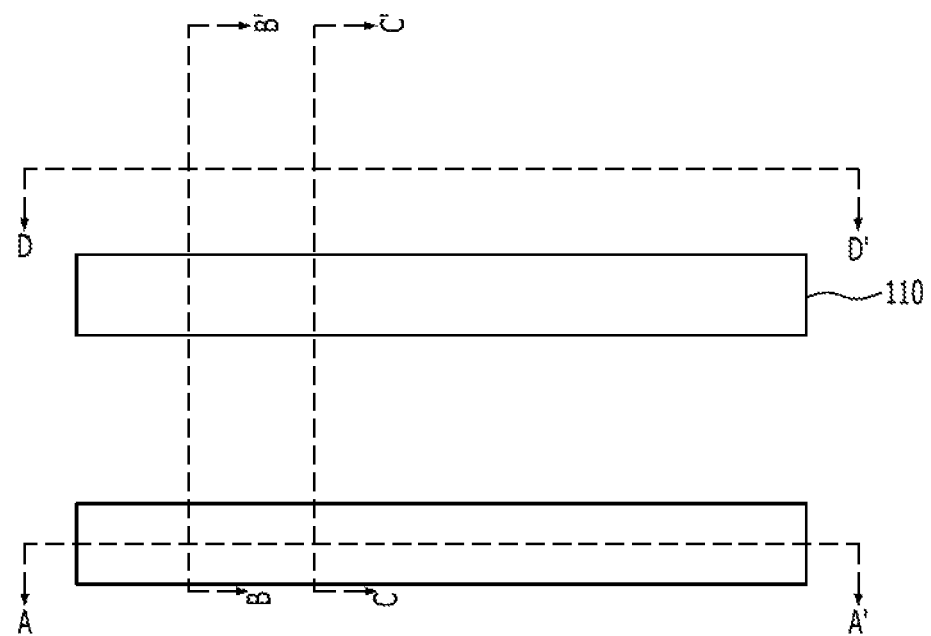
FIGS. 1A to 5C illustrate a semiconductor device and a method for fabricating the semiconductor device in accordance with an embodiment of the present disclosure.

Embodiments of the present disclosure are described below in detail with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description as having two or more layers in a multi-layer structure, the relative positioning of such layers or the sequence in which the layers are arranged reflects a particular implementation of an embodiment and a different relative positioning or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers exist between the first layer and the second layer or the substrate.

Figure 3A:
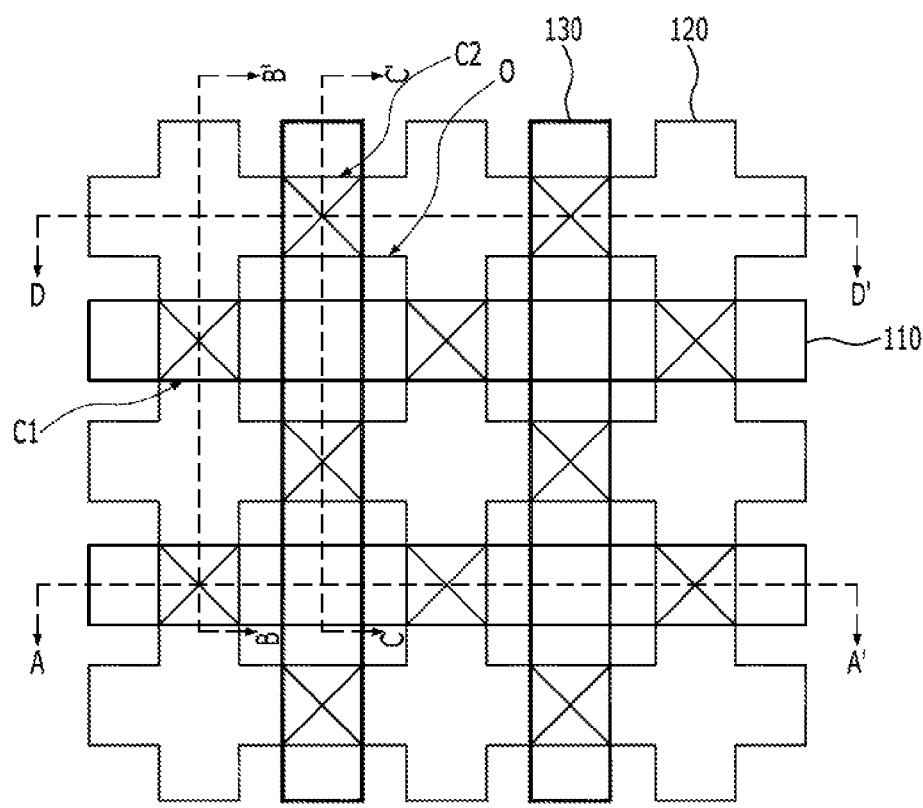
Figure 3B:
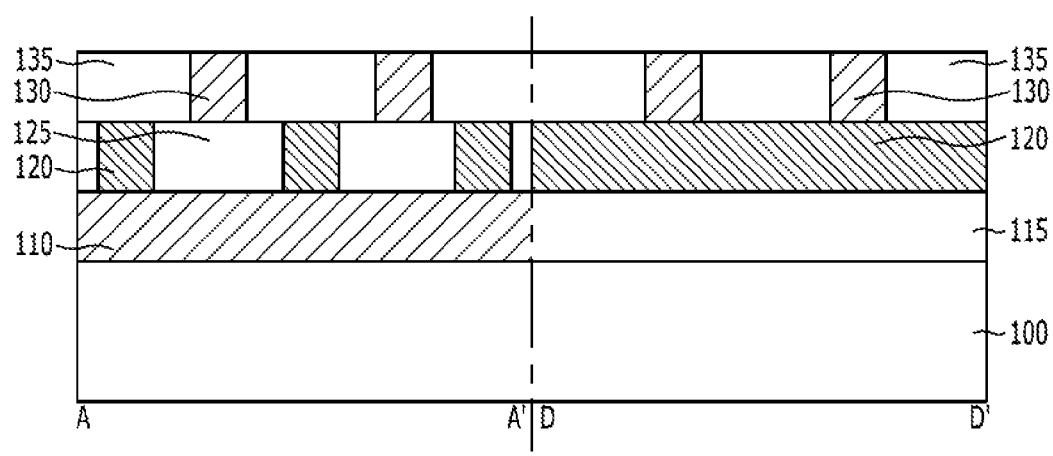
Figure 3C:
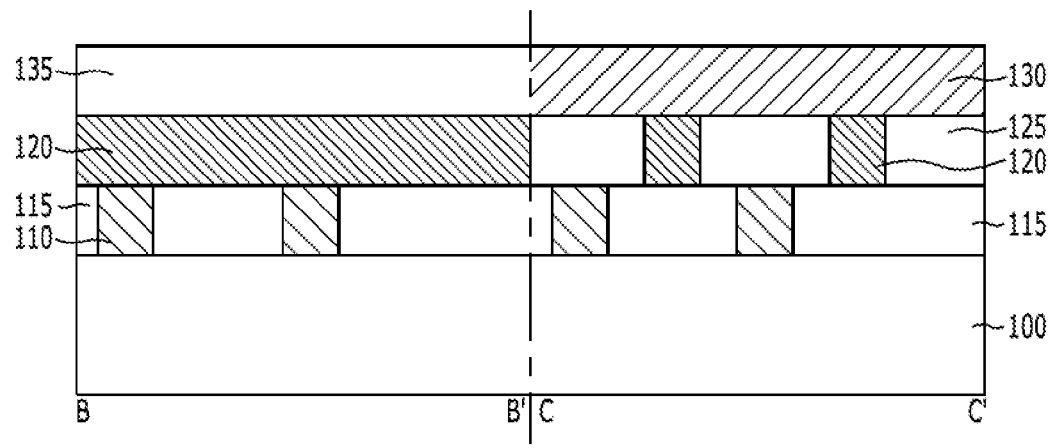
Figure 4A:
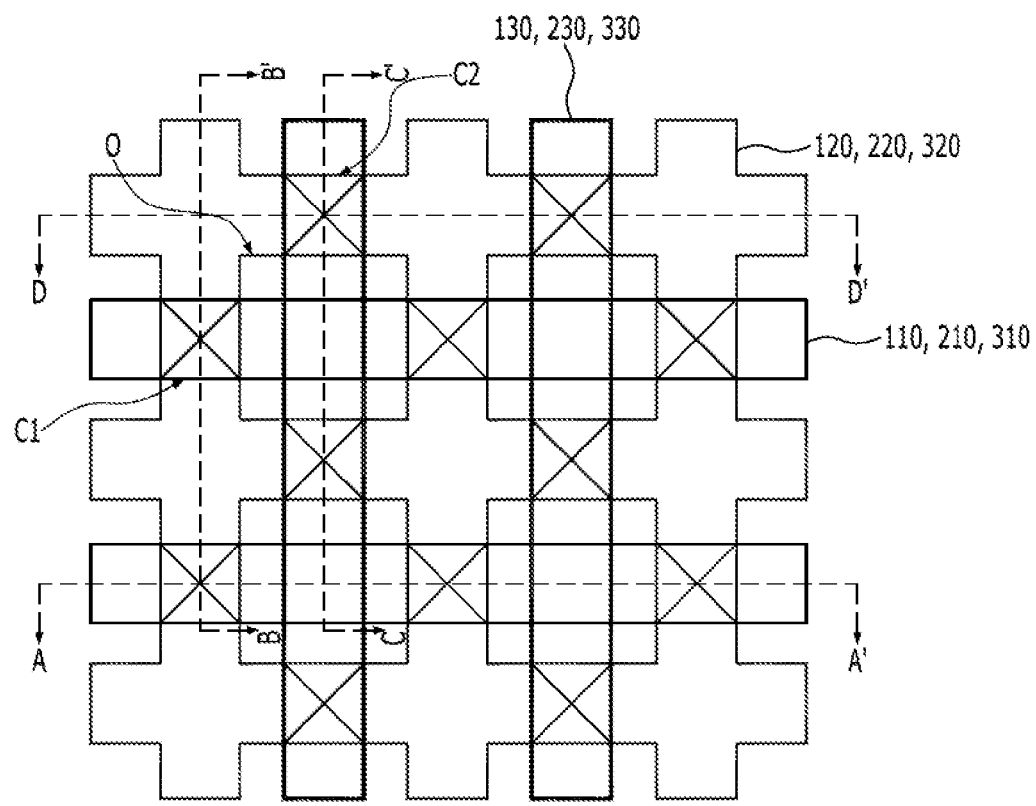
Figure 4B:
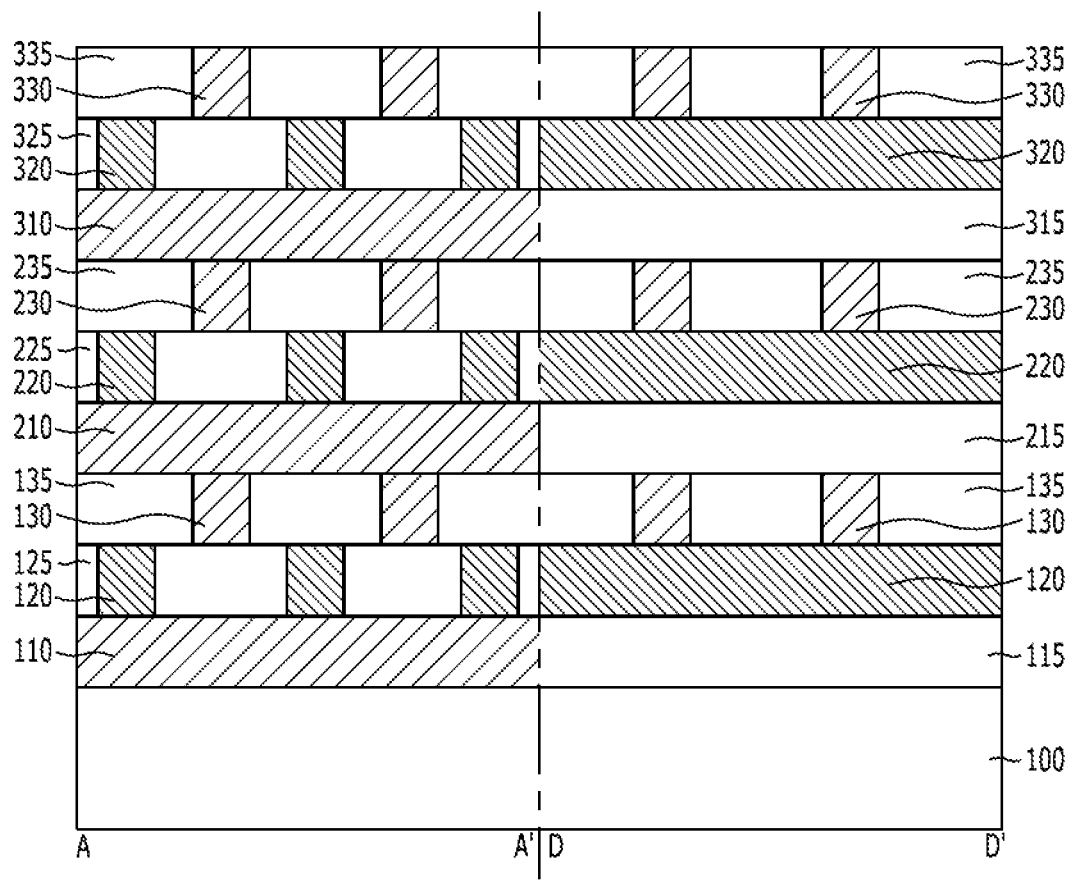
Figure 4C:
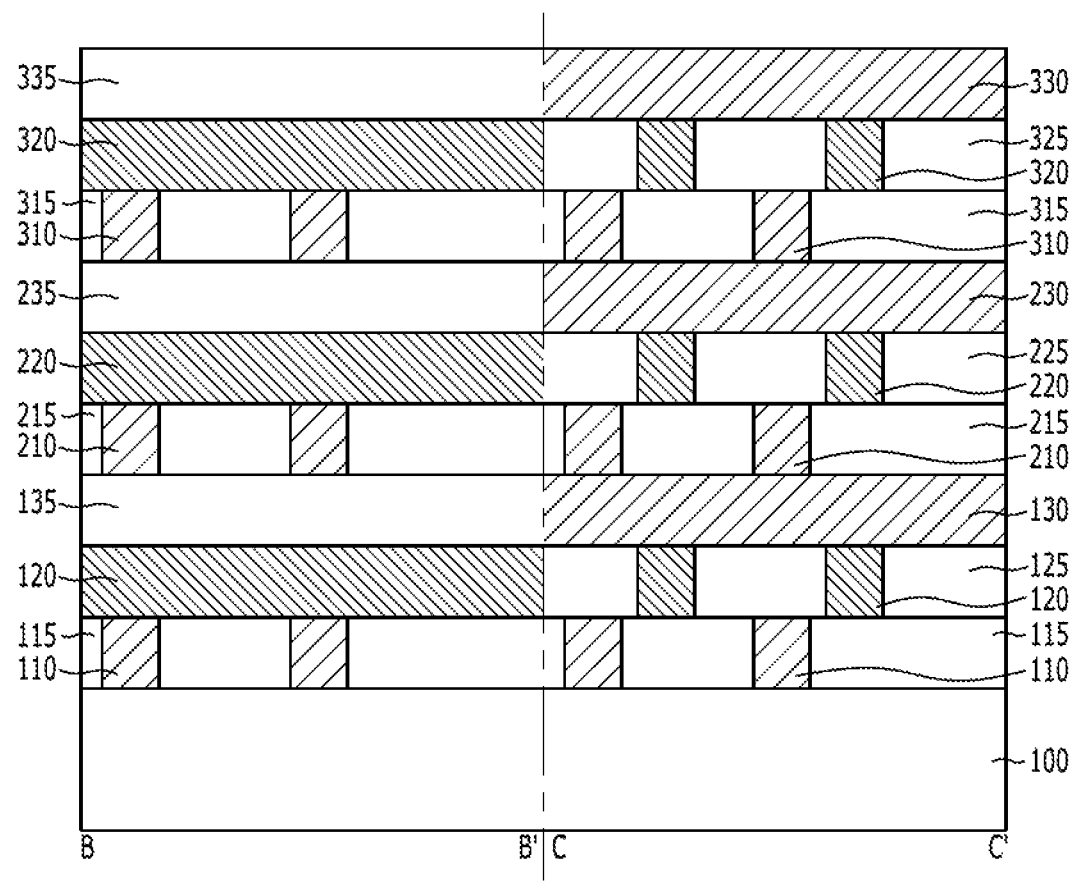
Figure 5A:
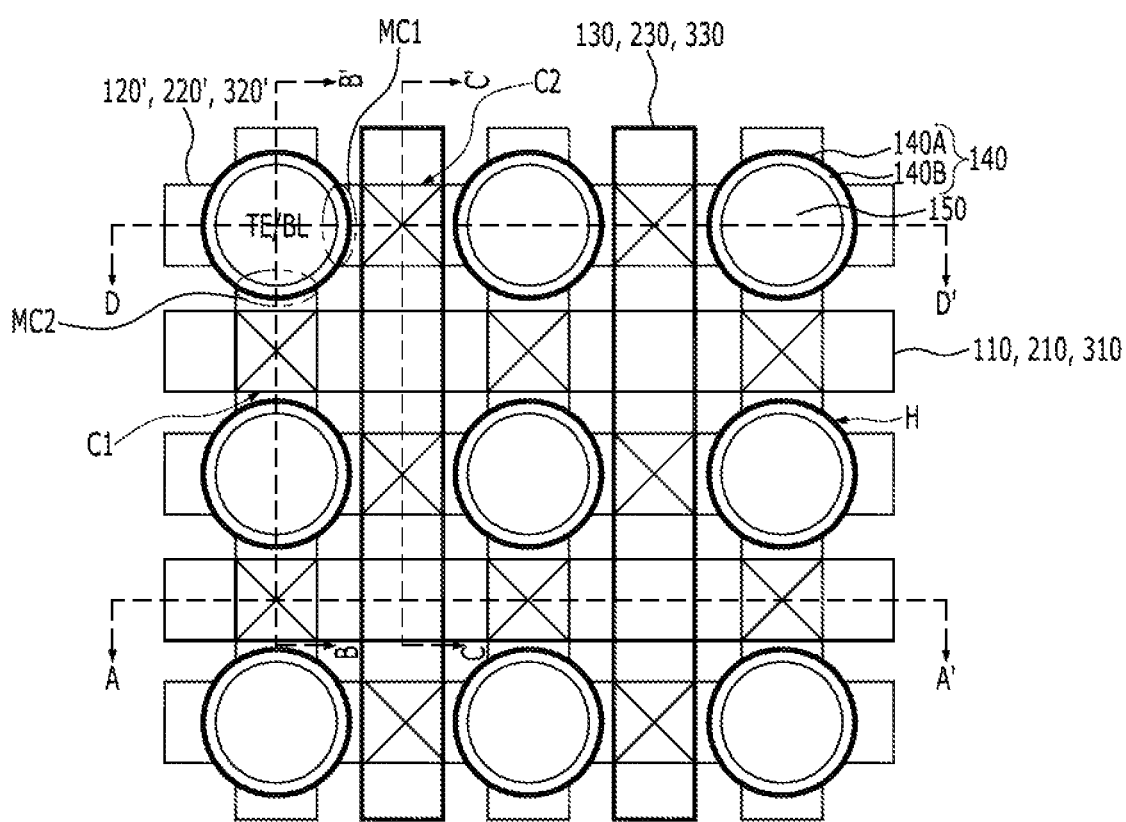
Figure 5B:
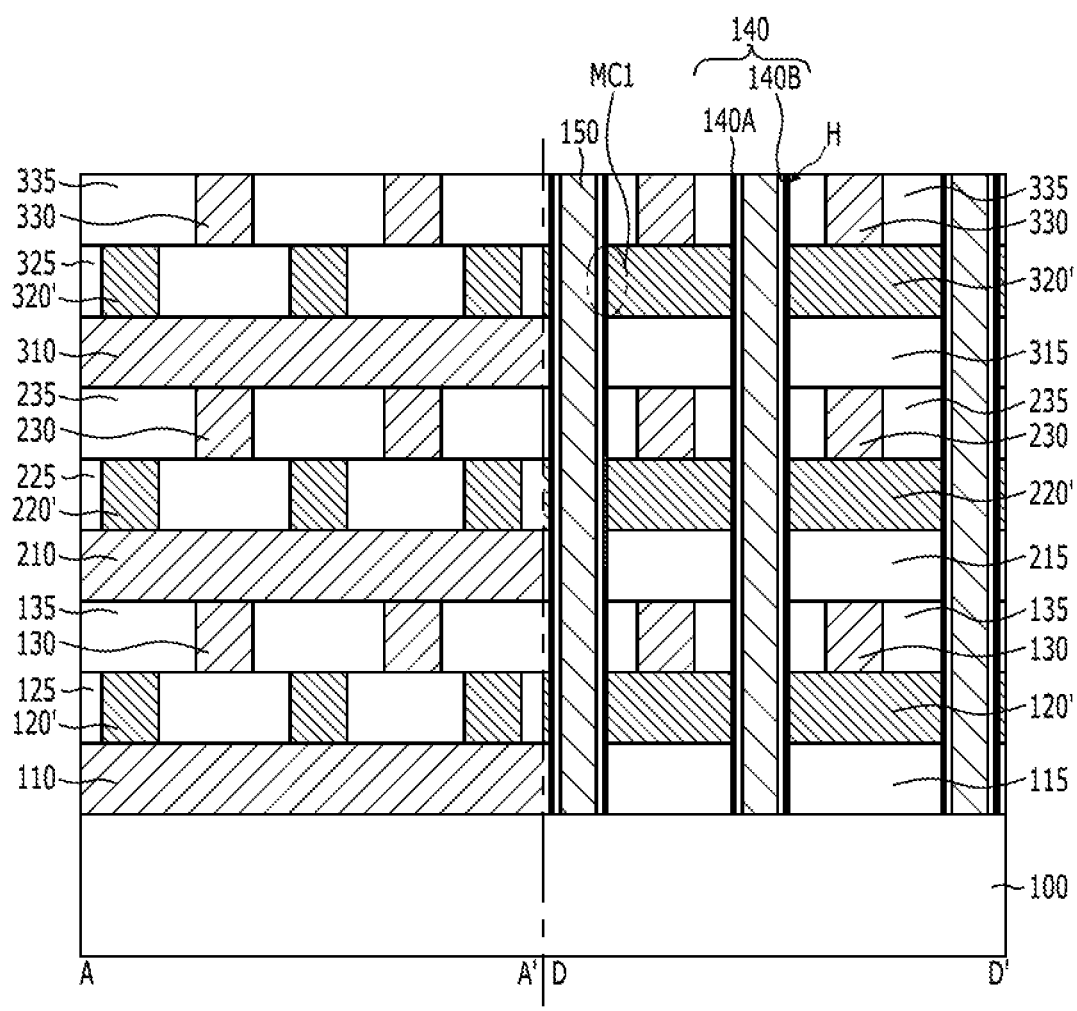
Figure 5C:
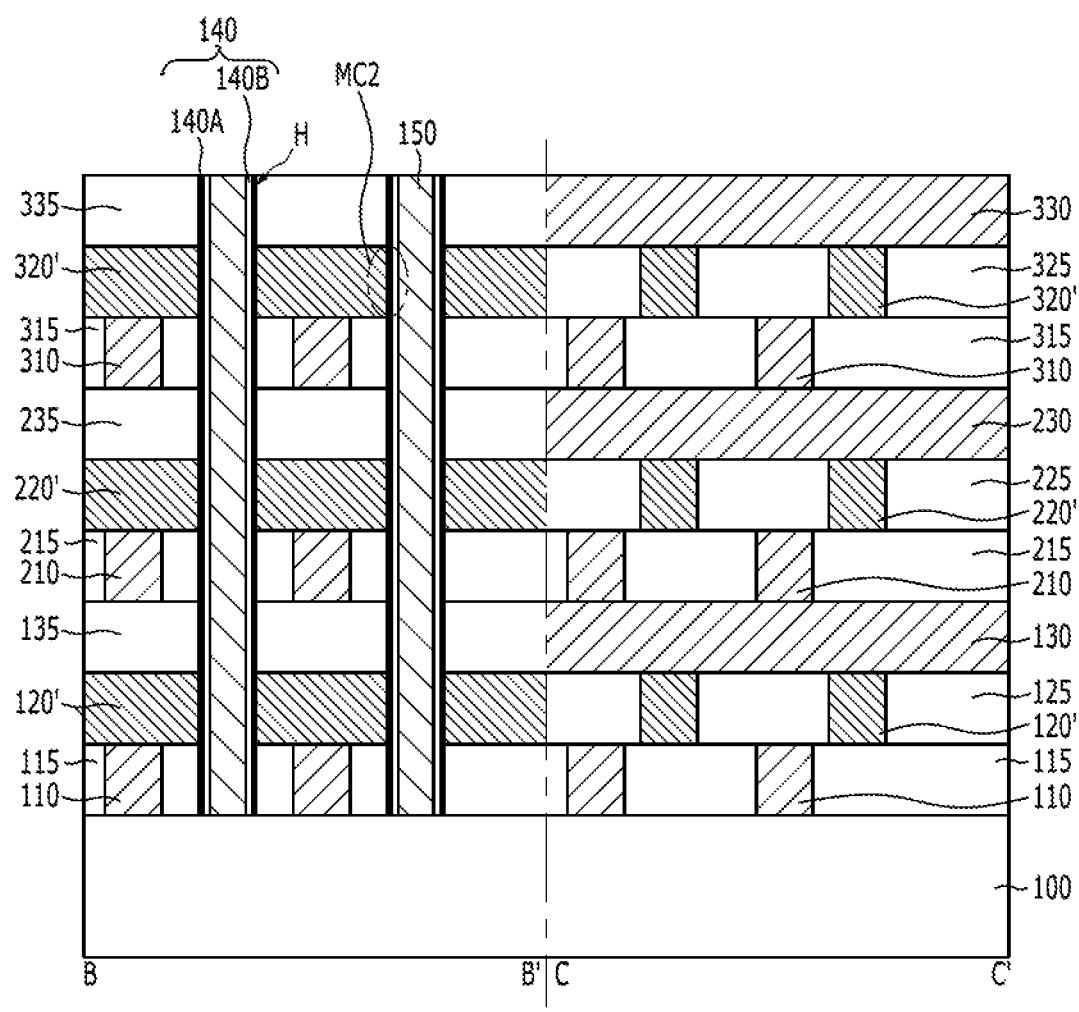

FIGS. 1A to 5C illustrate a semiconductor device and a method for fabricating the semiconductor device in accordance with an embodiment of the present disclosure. FIGS. 5A to 5C illustrate the semiconductor device in accordance with the embodiment of the present disclosure. FIGS. 1A to 4C illustrate an intermediate process for fabricating the semiconductor device shown in FIGS. 5A to 5C. Herein, FIGS. 1A, 2A, 3A, 4A and 5A are plan views of the semiconductor device, and FIGS. 1B, 2B, 3B, 4B and 5B are cross-sectional views of the semiconductor device taken along an A-A' line and a D-D' line of FIGS. 1A, 2A, 3A, 4A and 5A, respectively. FIGS. 1C, 2C, 3C, 4C and 5C are cross-sectional views of the semiconductor device taken along a B-B' line and a C-C' line of FIGS. 1A, 2A, 3A, 4A and 5A, respectively.

Figure 1B:
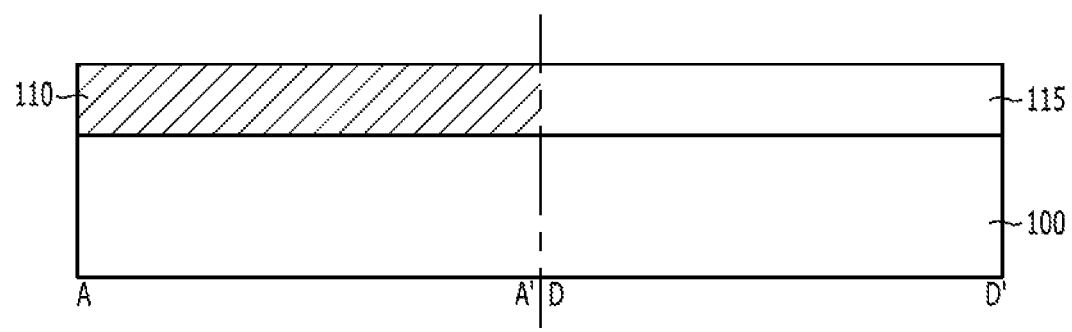
Figure 1C:
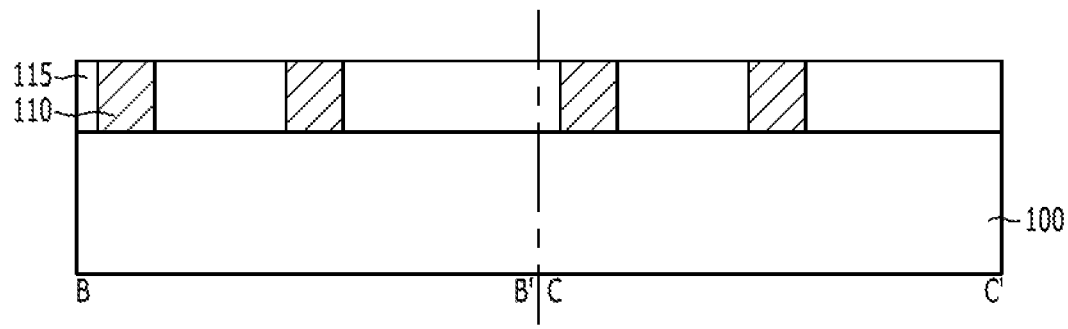

Referring to FIGS. 1A to 1C, a plurality of first lines 110 and a first insulation layer 115 are formed over a substrate 100 where a predetermined lower structure (not shown) is already formed. The first lines 110 stretch in a first direction (see the A-A' line and D-D' line), and are spaced apart from each other in a second direction (see the B-B' line and C-C' line), which intersects with the first direction. The first insulation layer 115 fills the space between the first lines 110.

The first lines 110 may be formed of various different conductive materials. For example, the conductive materials may include low-resistance metals, such as aluminum (Al), tungsten (W) and copper (Cu), which provide high electric conductivity characteristics. The first insulation layer 115 may be formed of various different insulation layers, such as an oxide, a nitride, and various combinations.

Figure 2A:
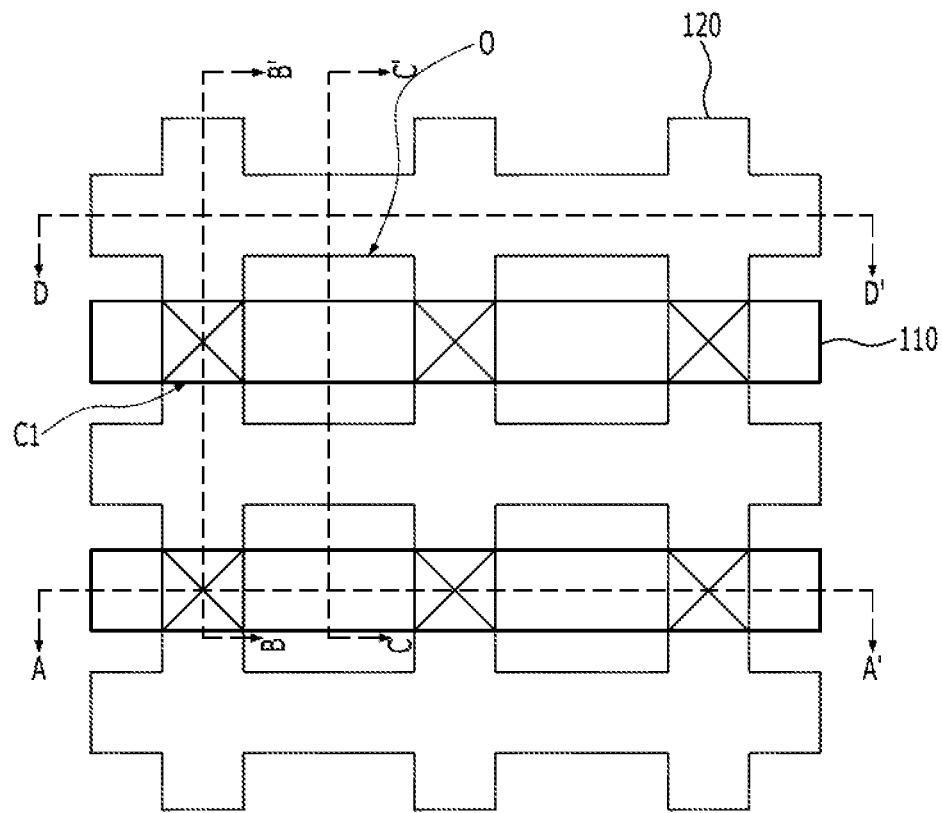
Figure 2B:
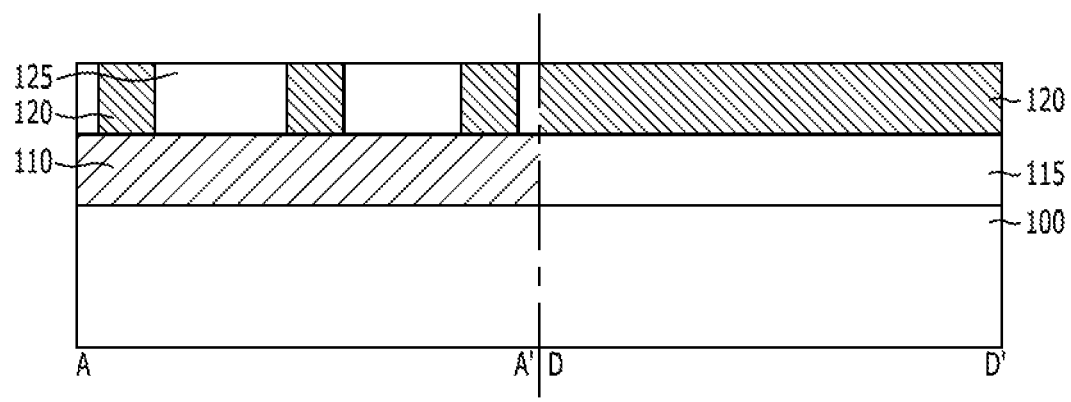
Figure 2C:
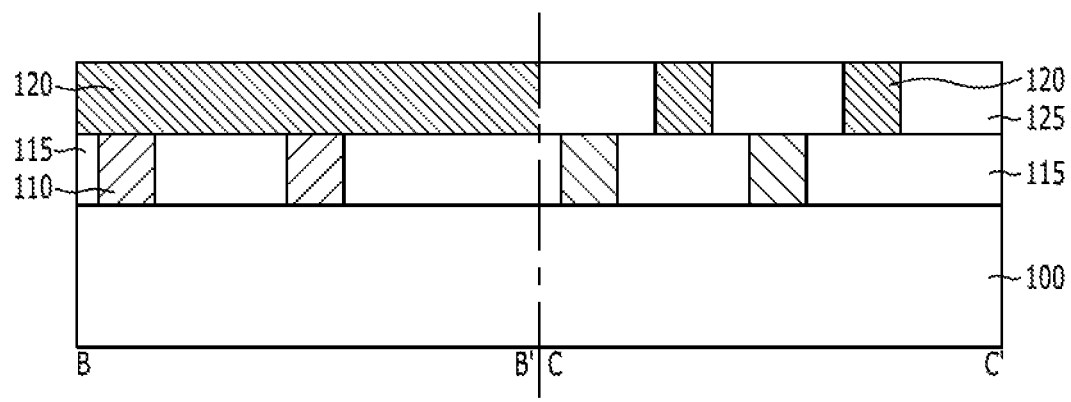

Referring to FIGS. 2A to 2C, a conductive layer 120 and a second insulation layer 125 are formed over the first lines 110 and the first insulation layer 115. The conductive layer 120 may have a mesh shape due to a plurality of openings O that are arranged in a checkered pattern in the first direction and the second direction. The second insulation layer 125 fills the openings O.

The openings O in the first direction, which may be referred to as a row of openings O, may overlap with the first lines 110. The openings O in the second direction, which may be referred to as a column of openings O may overlap with second lines to be formed in a subsequent process (shown as element '130' in FIGS. 3A to 5C). A cross-shaped portion of the conductive layer 120, defined by four neighboring openings O, may be disposed between the two neighboring first lines 110 in the second direction and the two neighboring second lines 130 in the first direction. For example, in a plan view, the cross-shaped portion of the conductive layer 120 may be disposed between the two neighboring first lines 110 and the two neighboring second lines 130 such that the cross-shaped portion of the conductive layer 120 does not overlap with the first lines 110 and/or the second lines 130. For this purpose, in an embodiment, a width of the opening O is greater than widths of the first line 110 and the second line 130. The cross-shaped portion, therefore, may be arranged in the form of a matrix along the first direction and the second direction.

A straight line-shaped portion of the conductive layer 120, which may be defined by two neighboring openings O in the first direction, may contact the first lines 110 (see C1 of FIG. 2A), and a straight line-shaped portion of the conductive layer 120, which may be defined by two neighboring openings O in the second direction, may contact the second lines 130 (see C2 of FIGS. 3A to 5C), which will be described later.

The conductive layer 120 may be formed of a conductive material that is different from the material that forms the first lines 110. In an embodiment, the conductive layer 120 is formed of a material having a reactivity that is lower than a reactivity of the material of the first lines 110. Example materials having a reactivity that is lower than a reactivity of the material of the first lines 110 include a metal nitride, (e.g., a titanium nitride (TiN) and a tantalum nitride (TaN)), and/or a noble metal material (e.g., platinum (Pt) and gold (Au)). The second insulation layer 125 may be formed of diverse insulating substances, such as an oxide, a nitride, and various combinations.

Referring to FIGS. 3A to 3C, a plurality of second lines 130 and a third insulation layer 135 are formed over the conductive layer 120 and the second insulation layer 125. The second lines 130 stretch in the second direction and are spaced apart from each other in the first direction. The third insulation layer 135 fills the space between the second lines 130. As described herein, the second lines 130 may overlap with the openings O and may contact a portion of the conductive layer 120 disposed between neighboring openings O in the second direction (see C2 of FIG. 3A).

The second lines 130 may be formed of various different conductive materials, which include low-resistance metals. The third insulation layer 135 may be formed of various different insulating substances, such as an oxide, a nitride, and various combinations.

In some embodiments, the processes depicted in FIGS. 1 to 3C are performed repeatedly (e.g., more than two times) in order to create a first structure, a second structure, a third structure, and so on.

Referring to FIGS. 4A to 4C, a device includes three stacked structures that include the first structure, the second structure, and the third structure, each including the first lines 110, the first insulation layer 115, the conductive layer 120, the second insulation layer 125, the second lines 130, and the third insulation layer 135, but embodiments are not limited thereto. In other embodiments, the number of stacked structures may be greater or fewer. As shown in FIGS. 4A to 4C, the first lines, the first insulation layer, the conductive layer, the second insulation layer, the second lines, and the third insulation layer of the second structure are denoted as reference numerals '210', '215', '220', '225', '230', and '235', respectively, and the first lines, the first insulation layer, the conductive layer, the second insulation layer, the second lines, and the third insulation layer of the third structure are denoted as reference numerals '310', '315', '320', '325', '330', and '335', respectively.

Referring to FIGS. 5A to 5C, a plurality of holes H that stretch in a direction perpendicular to the substrate 100 is formed by forming a mask pattern (not shown), which exposes portions of the third insulation layer 135 that correspond to cross-shaped portions of the conductive layers 120, 220 and 320, over the first to third structures, and etching the conductive layers 120, 220 and 320 and the first to third insulation layers 115, 125, 135, 215, 225, 235, 315, 325 and 335 by using the mask pattern as an etch barrier. As shown in a plan view of FIG. 5A, the holes H may overlap with the cross-shaped portions of the conductive layer 120, and may have an area that is wider or larger than an area of the cross-shaped portions of the conductive layer 120.

The etched conductive layers 120, 220 and 320 may be separated from each other on both sides of the holes H in the first direction and on both sides of the holes H in the second direction. Hereafter, the etched conductive layers 120, 220 and 320 are referred to as conductive patterns 120', 220' and 320'. As shown in the plan view of FIG. 5A, the conductive patterns 120', 220' and 320' are arranged in the form of a matrix in the first direction and the second direction between neighboring holes H.

The conductive patterns 120', 220' and 320' disposed on both sides of the holes H in the first direction may contact the second lines 130, 230 and 330 that are disposed over the conductive patterns 120', 220' and 320', and the conductive patterns 120', 220' and 320' disposed on both sides of the holes H in the second direction may contact the first lines 110, 210 and 310 that are disposed under the conductive patterns 120', 220' and 320'.

Subsequently, a memory layer 140 is formed on a sidewall of each of the holes H, and conductive pillars 150 are formed by filling the remaining portions of the holes H after forming the memory layer 140 with a conductive material.

Because the memory layer 140 functions to store data, the memory layer 140 may include a variable resistance layer 140A and a selection device layer 140B.

The variable resistance layer 140A may switch between different resistance states according to a voltage or current applied through the conductive patterns 120', 220' and 320' and the conductive pillars 150. The variable resistance layer 140A may have a single layer structure or a multi-layer structure, including various different materials used for a resistive random access memory (RRAM) device, a phase change random access memory (PRAM) device, a ferroelectric random access memory (FRAM) device, a magnetic random access memory (MRAM) device, and so on. For example, the materials may include a metal oxide such as a transition metal oxide and a perovskite-based material, a phase-change material such as a chalcogenide-based material, a ferroelectric material, and a ferromagnetic material.

In an embodiment, when the variable resistance layer 140A includes a metal oxide used for an RRAM device, the variable resistance layer 140A may switch between a high resistance state and a low resistance state based on whether or not a filament current path is formed due to the movement of oxygen vacancies in the metal oxide. The filament current path of the variable resistance layer 140A may be formed in a direction parallel to the substrate 100, because the filament current path is formed or disappears between the conductive patterns 120', 220' and 320' and the conductive pillars 150.

The selection device layer 140B controls the supply of the voltage or current to the variable resistance layer 140A. The selection device layer 140B may be any device having non-linear current-voltage characteristics. The selection device layer 140B may prevent current from flowing when a voltage level of the applied voltage is below a predetermined threshold voltage level, and may allow current to flow when the voltage level is equal to or higher than the predetermined threshold voltage level. In some embodiments, the selection device layer 140B includes any of a diode, a transistor, a varistor, an MIT (Metal-Insulator Transition) device, a tunneling barrier and the like. In some embodiments, the current flow of the selection device layer 140B is in parallel to the substrate 100.

Although element "140A" is described as a variable resistance layer and element "140B" is described as a selection device layer in various embodiments of the present disclosure, in other embodiments, the element "140A" may be a selection device layer and the element "140B" may be a variable resistance layer. In some embodiments, the selection device layer 140B may be omitted.

The conductive pillars 150 may be formed of various different conductive materials, including low-resistance metals.

As a result of the processes described herein, the semiconductor device shown in FIGS. 5A to 5C may be fabricated.

Referring back to FIGS. 5A to 5C, the conductive pillars 150 and the memory layers 140 may be disposed over the substrate 100. The conductive pillars 150 stretch in a direction perpendicular to the substrate 100 and arranged in the first direction and the second direction. The memory layer 140 surrounds sidewalls of each conductive pillar 150.

The first lines 110, 210 and 310 that stretch in the first direction may be disposed between the conductive pillars 150 that are arranged in the second direction, and the second lines 130, 230 and 330 that stretch in the second direction may be disposed between the conductive pillars 150 that are arranged in the first direction. The first lines 110, 210 and 310 and the conductive pillars 150 are spaced apart and insulated from each other, and the second lines 130, 230 and 330 and the conductive pillars 150 are spaced apart and insulated from each other. Also, the first lines 110, 210 and 310 and the second lines 130, 230 and 330 are disposed at different levels in a vertical direction perpendicular to the substrate 100.

The conductive patterns 120', 220' and 320' contacting the conductive pillars 150 may be disposed between the conductive pillars 150 that are neighboring to each other in the first direction and the second direction, the memory layer 140 being disposed between the conductive pillars 150 and the conductive patterns 120', 220' and 320'. The conductive patterns 120', 220' and 320' may be disposed between the first lines 110, 210 and 310 and the second lines 130, 230 and 330 in the vertical direction.

As shown in the plan view of FIG. 5A, one conductive pillar 150 may contact multiple conductive patterns 120', 220' and 320' that are disposed on both sides of the conductive pillar 150 in the first direction and both sides in the second direction. Herein, the conductive patterns 120', 220' and 320' disposed on both sides of the conductive pillar 150 in the second direction may contact the first lines 110, 210 and 310 (see C1), which are disposed under the conductive patterns 120', 220' and 320' and stretch in the first direction, to be electrically coupled to the first lines 110, 210 and 310. The conductive patterns 120', 220' and 320' disposed on both sides of the conductive pillar 150 in the first direction may contact the second lines 130, 230 and 330 (see C2), which are disposed over the conductive patterns 120', 220' and 320' and stretch in the second direction, to be electrically coupled to the second lines 130, 230 and 330.

In some embodiments, one memory cell may be formed of one conductive pillar 150 and a portion of the memory layer 140 disposed between the conductive pillar 150 and each of the conductive patterns 120', 220' and 320' contacting the conductive pillar 150. An operation of each memory cell may be controlled by the conductive pillar 150 that is coupled with a corresponding portion of the memory layer 140, and one of the first lines 110, 210 and 310 or second lines 130, 230 and 330 that contact a corresponding one of the conductive patterns 120', 220' and 320' coupled with the corresponding memory cell. For example, the memory layer 140 disposed on both sides of the conductive pillar 150 in the first direction may have a resistance that is changed based on a voltage or current supplied from the conductive pillar 150 and a selected one of the second lines 130, 230 and 330. Also, the memory layer 140 disposed on both sides of the conductive pillar 150 in the second direction may have a resistance that is changed based on a voltage or current supplied from the conductive pillar 150 and a selected one of the first lines 110, 210 and 310. In other words, the conductive pillar 150 may act or serve as a bit line, the first lines 110, 210 and 310 and/or the second lines 130, 230 and 330 may act or serve as word lines. The conductive patterns 120', 220' and 320' may act or serve as electrodes disposed between the first lines 110, 210 and 310 and the memory layer 140, and/or between the second lines 130, 230 and 330 and the memory layer 140, to electrically couple the first lines 110, 210 and 310 and the memory layer 140, and/or the second lines 130, 230 and 330 and the memory layer 140, respectively.

As an example, in FIGS. 5A and 5B, a first memory cell MC1 may include the conductive pillar 150, which is disposed in an intersection region between the D-D' line and the B-B' line, and the memory layer 140, which is disposed between the conductive pillar 150, and the conductive pattern 320' disposed on a first side of the conductive pillar 150 in the first direction among the conductive patterns 320' of the third structure. The first memory cell MC1 may be controlled by the conductive pillar 150 of the first memory cell MC1 and the second line 330 that contacts the upper surface of the conductive pattern 320' coupled to the first memory cell MC1.

As another example, in FIGS. 5A and 5C, a second memory cell MC2 may include the conductive pillar 150, which is disposed in the intersection region between the D-D' line and the B-B' line, and the memory layer 140, which is disposed between the conductive pillar 150 and the conductive pattern 320' disposed on a second side of the conductive pillar 150 in the second direction among the conductive patterns 320' of the third structure. The second memory cell MC2 may be controlled by the conductive pillar 150 of the second memory cell MC2 and the first line 310 that contacts the lower surface of the conductive pattern 320' coupled to the second memory cell MC2.

Thus, in some embodiments, the semiconductor devices and fabrication methods described herein may provide the following:

A cell structure having a plurality of stacked memory cells may be formed, and thus an integration degree may be raised (e.g., because four or more cell structures arise for every conductive pillar 150, the integration degree may be greatly enhanced).

Multiple memory cells may be formed to not directly contact the first lines 110, 210 and 310 or the second lines 130, 230 and 330, but to contact the lines through the conductive patterns 120', 220' and 320', and, the conductive patterns 120', 220' and 320' may be formed of a material that is different from the material of the first lines 110, 210 and 310 or from the material of the second lines 130, 230 and 330. When the conductive patterns 120', 220' and 320' and the first lines 110, 210 and 310 or the second lines 130, 230 and 330 are formed of different materials, specified or desired characteristics of a semiconductor device may be realized. For example, forming the first lines 110, 210 and 310 or the second lines 130, 230 and 330 of a low-resistance metal may increase an operation rate of a semiconductor device.

In some embodiments, by forming the conductive patterns 120', 220' and 320' of a metal nitride or noble metal having a lower reactivity than a metal, the characteristics of the memory layer 140 may be prevented from deteriorating due to an undesired reaction between the memory layer 140 and the conductive patterns 120', 220' and 320'. For example, unlike the embodiments, when the first lines 110, 210 and 310 or the second lines 130, 230 and 330 are formed of a low-resistance metal and directly contact the memory layer 140 without any conductive pattern, an oxide interface may be formed due to the bonding between the low-resistance metal and the metal oxide of the memory layer 140, or the metal may permeate into the memory layer 140. As a result, memory cell characteristics are deteriorated. As another example, when the first lines 110, 210 and 310 or the second lines 130, 230 and 330 are formed of a metal nitride or noble metal, the operation rate of the semiconductor device may be less than desired and the fabrication cost may increase. Using the fabrication methods described herein may alleviate such problems, as low cost, high operation rate semiconductor devices that do not deteriorate may be realized.

In some embodiments, the conductive patterns 120', 220' and 320' may be formed through a one-time process of forming holes H that penetrate through the conductive layers 120, 220 and 320, and the memory layer 140 may be formed in the internal wall of each hole H. In these embodiments, a sufficient and/or desired contact area between the memory layer 140 and the conductive patterns 120', 220' and 320' may be obtained and the contact area may be uniformly made on the four sides of each and every conductive pillar 150. As a result, the characteristics of memory cells may be uniform, and the semiconductor device may operate in stable manner. In addition, the fabrication process of such semiconductor devices may be an easy and simple process.

Therefore, in some embodiments, high integration may be achieved with reduced process difficulties, and excellent memory cell characteristics and operation characteristics may be obtained for semiconductor devices.

The above and other memory circuits or semiconductor devices based on the disclosed technology can be used in a range of devices or systems. FIGS. 6-10 provide some examples of devices or systems that can implement a memory circuit in accordance with an embodiment.

Figure 6:
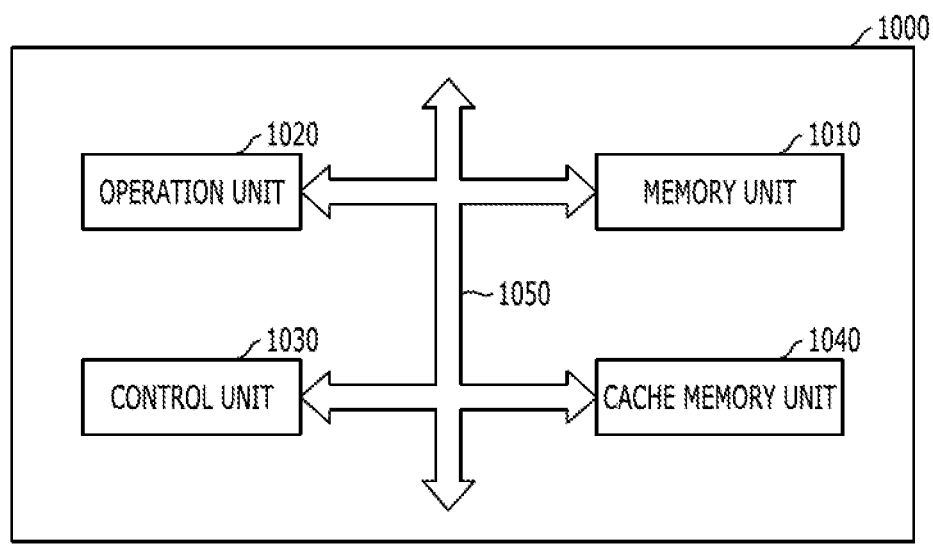
FIG. 6 illustrates a microprocessor implementing memory circuitry based on the disclosed technology.

FIG. 6 illustrates a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part, which stores data in the microprocessor 1000, as a processor register, register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the memory unit 1010 may be raised and data storage characteristics of the memory unit 1010 may be improved. As a consequence, a size of the microprocessor 1000 may be reduced and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
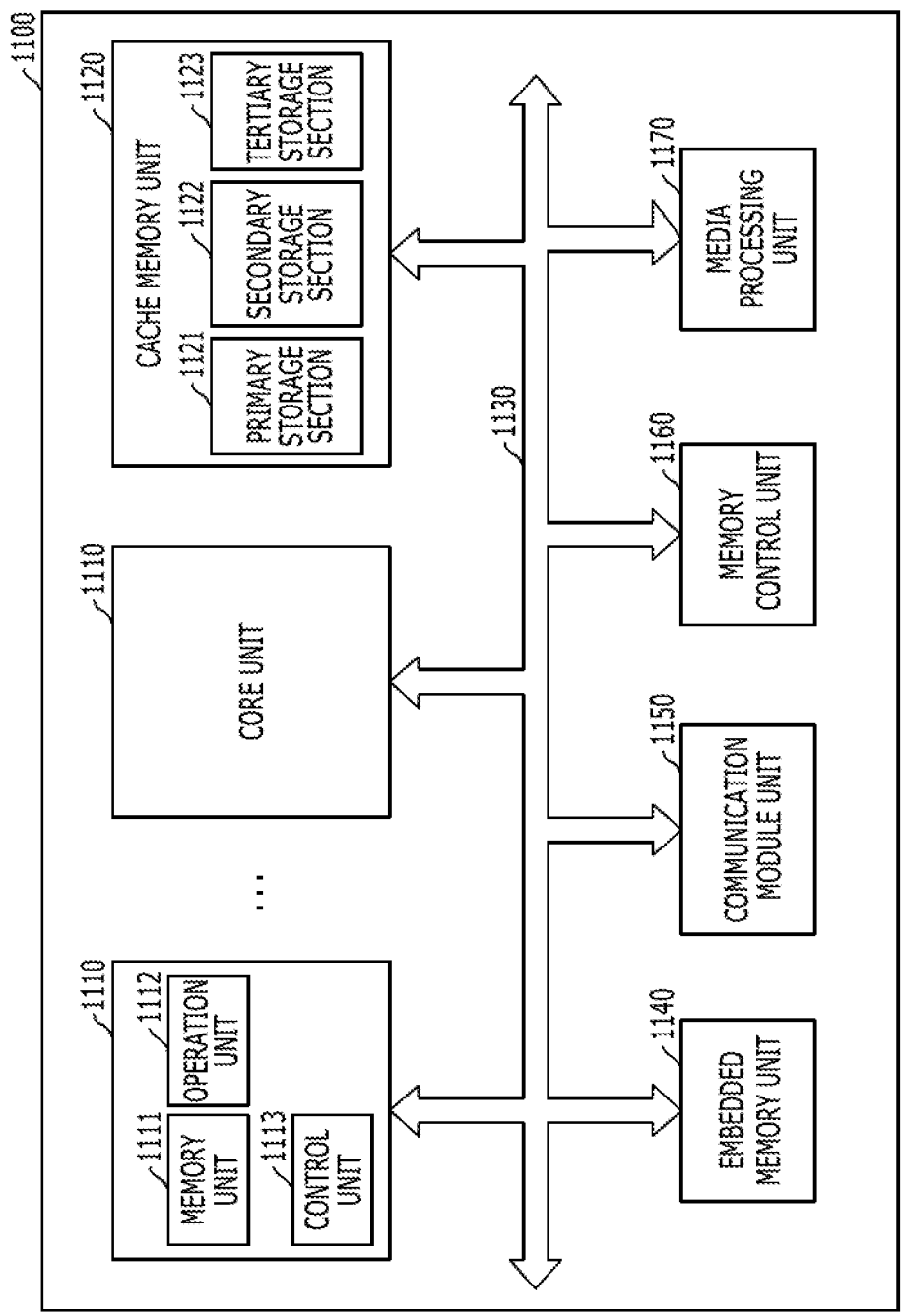
FIG. 7 illustrates a processor implementing memory circuitry based on the disclosed technology.

FIG. 7 illustrates a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the cache memory unit 1120 may be raised and data storage characteristics of the cache memory unit 1120 may be improved. As a consequence, a size of the processor 1100 may be reduced and performance characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
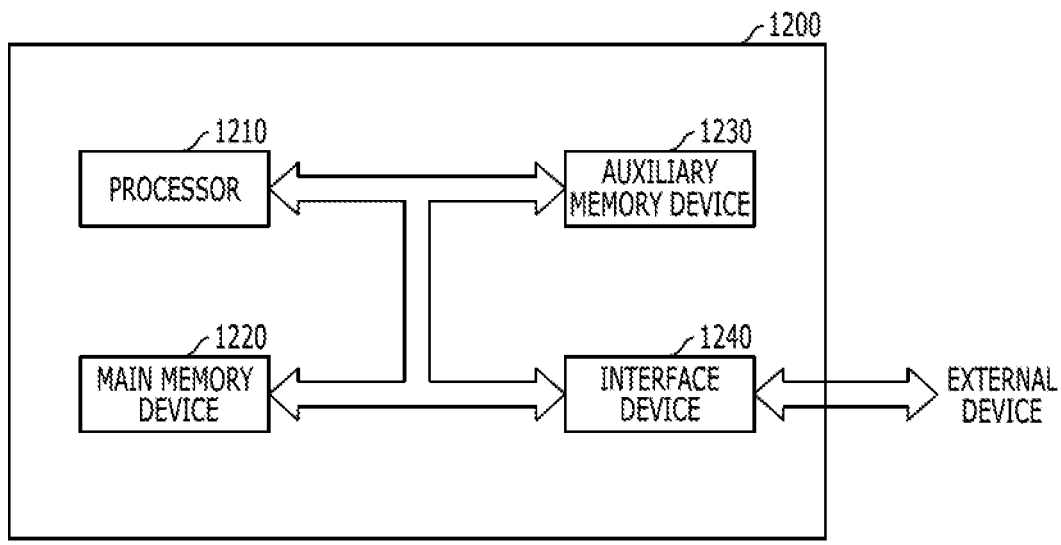
FIG. 8 illustrates a system implementing memory circuitry based on the disclosed technology.

FIG. 8 illustrates a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the main memory device 1220 may be raised and data storage characteristics of the main memory device 1220 may be improved. As a consequence, a size of the system 1200 may be reduced and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the auxiliary memory device 1230 may be raised and data storage characteristics of the auxiliary memory device 1230 may be improved. As a consequence, a size of the system 1200 may be reduced and performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
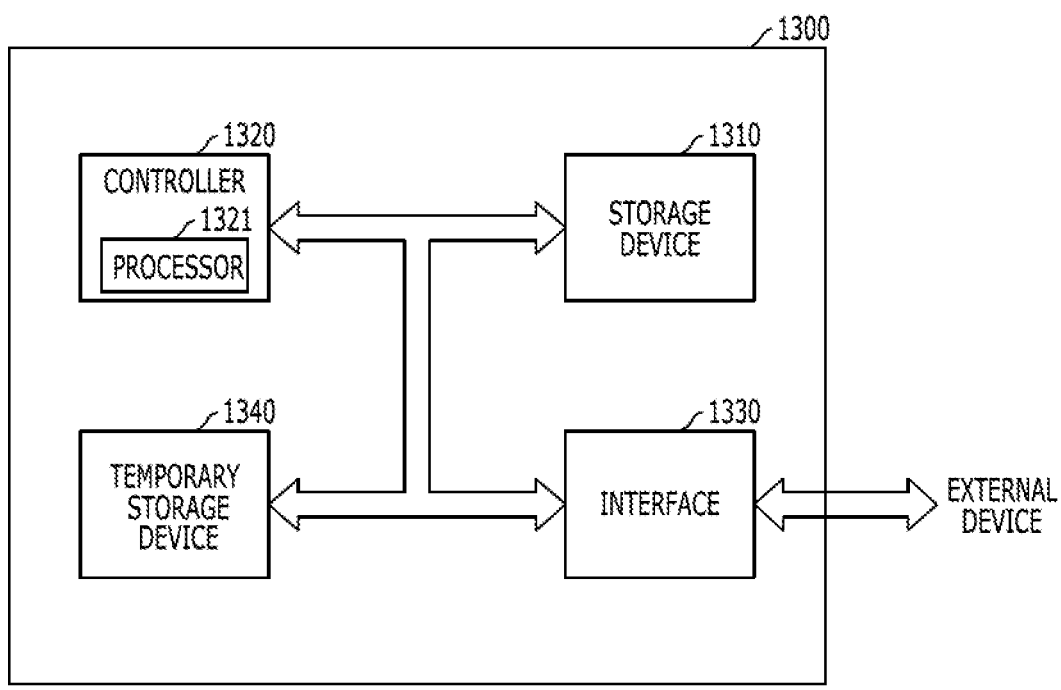
FIG. 9 illustrates a data storage system implementing memory circuitry based on the disclosed technology.

FIG. 9 illustrates a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the temporary storage device 1340 may be raised and data storage characteristics of the temporary storage device 1340 may be improved. As a consequence, a size of the data storage system 1300 may be reduced and performance characteristics of the data storage system 1300 may be improved.

Figure 10:
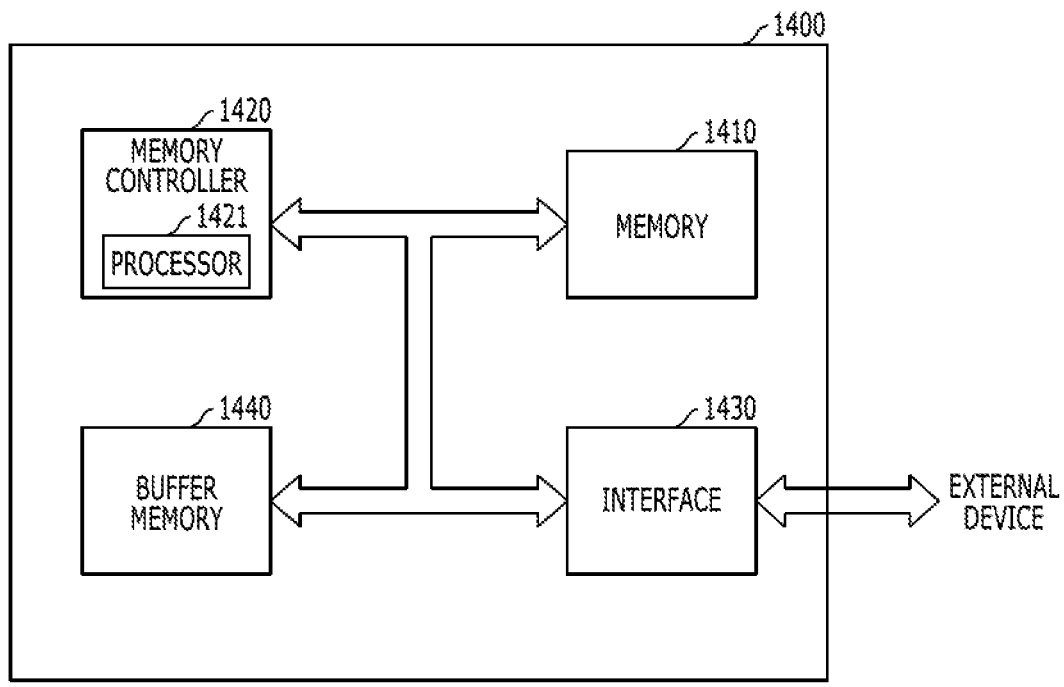
FIG. 10 illustrates a memory system implementing memory circuitry based on the disclosed technology.

FIG. 10 illustrates a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the memory 1410 may be raised and data storage characteristics of the memory 1410 may be improved. As a consequence, a size of the memory system 1400 may be reduced and performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of conductive pillars that stretch in a direction perpendicular to a substrate, the plurality of conductive pillars arranged in a first direction and a second direction that intersects the first direction; conductive patterns disposed between the conductive pillars in the first direction and the second direction; variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar; first lines disposed between the conductive pillars in the second direction and stretch in the first direction, the first lines contacting the conductive patterns under the conductive patterns; and second lines disposed between the conductive pillars in the first direction and stretch in the second direction, the second lines contacting the conductive patterns over the conductive patterns. Through this, integration degree of the buffer memory 1440 may be raised and data storage characteristics of the buffer memory 1440 may be improved. As a consequence, a size of the memory system 1400 may be reduced and performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features of the above electronic devices or systems in FIGS. 6-10 based on a memory device in accordance with an embodiment of the present disclosure may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While the present disclosure contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in the present disclosure should not be understood as requiring such separation in all embodiments.

Only a few implementations and examples are described. Other implementations, enhancements and variations can be made based on what is described and illustrated in the present disclosure.

What is claimed is:

1. An electronic device having a semiconductor memory unit, the semiconductor memory unit comprising:
    a plurality of conductive pillars that stretch in a direction perpendicular to a substrate, the plurality of conductive pillars arranged in a first direction and a second direction that intersects the first direction;
    conductive patterns disposed between the conductive pillars in the first direction and the second direction;
    variable resistance layers each of which is disposed between a corresponding one of the conductive pillars and a corresponding one of the conductive patterns adjacent to the corresponding conductive pillar, said each of the variable resistance layers contacting the corresponding conductive pattern and the corresponding conductive pillar;
    first lines disposed between the conductive pillars in the second direction and stretch in the first direction, the first lines contacting the conductive patterns under the conductive patterns; and
    second lines disposed between the conductive pillars in the first direction and stretch in the second direction, the second lines contacting the conductive patterns over the conductive patterns.

2. The electronic device according to claim 1, wherein the conductive patterns include a material that is different from materials of the first lines and the second lines.

3. The electronic device according to claim 2, wherein the first lines and the second lines include materials having a lower resistance than the material of the conductive patterns, and
    wherein the conductive patterns include a material having a lower reactivity than the materials of the first lines and the second lines.

4. The electronic device according to claim 3, wherein the first lines and the second lines include a metal, and
    wherein the conductive patterns include a metal nitride or a noble metal.

5. The electronic device according to claim 1, wherein a structure including the first lines, the conductive patterns, and the second lines is stacked a plurality of times over the substrate in a vertical direction.

6. The electronic device according to claim 1, further comprising:
    a first insulation layer disposed between the first lines and the conductive pillars; and
    a second insulation layer disposed between the second lines and the conductive pillars.

7. The electronic device according to claim 1, further comprising:
    a selection device layer disposed between a variable resistance layer and a corresponding one of the conductive pillars, or disposed between a variable resistance layer and corresponding one of the conductive patterns.

8. The electronic device according to claim 1, wherein a first plurality of variable resistance layers disposed on sides of the conductive pillars in the first direction are controlled by the conductive pillars and the second lines, and
    wherein a second plurality of variable resistance layers disposed on sides of the conductive pillars in the second direction are controlled by the conductive pillars and the first lines.

9. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

10. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

11. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

12. The electronic device according to claim 1, further comprising a data storage system which includes:

a storage device configured to store data and conserve stored data regardless of power supply;

a controller configured to control input and output of data to and from the storage device according to a command inputted from an outside;

a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

13. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

14. An electronic device having a semiconductor memory unit, the semiconductor memory unit comprising:

a conductive pillar that stretches in a direction perpendicular to a substrate;

a variable resistance layer including first and second portions, the first portion being disposed on a first side of the conductive pillar and the second portion being disposed on a second side of the conductive pillar;

a first conductive pattern contacting the first portion of the variable resistance layer;

a second conductive pattern contacting the second portion of the variable resistance layer;

a first line that stretches in a first direction and contacts the first conductive pattern under the first conductive pattern; and a second line that stretches in a second direction that intersects with the first direction and contacts the second conductive pattern over the second conductive pattern.

15. The electronic device according to claim 14, wherein the first conductive pattern and the second conductive pattern include a material that is different from materials of the first line and the second line.

16. The electronic device according to claim 15, wherein the first line and the second line include materials having a lower resistance than the materials of the first and second conductive patterns, and wherein the first and second conductive patterns include materials having a lower reactivity than the materials of the first line and the second line.

17. The electronic device according to claim 14, wherein a structure including the first line, the first conductive pattern, the second conductive pattern and the second line is stacked a plurality of times over the substrate in a vertical direction.

18. The electronic device according to claim 14, further comprising:

a selection device layer disposed between the variable resistance layer and the conductive pillar, or disposed between the variable resistance layer and the first and second conductive patterns.

* * * * *